(12) United States Patent
Czamara

(10) Patent No.: US 9,622,387 B1
(45) Date of Patent: Apr. 11, 2017

(54) RACK-MOUNTED AIR DIRECTING DEVICE WITH SCOOP

(75) Inventor: Michael P. Czamara, Seattle, WA (US)

(73) Assignee: Amazon Technologies, Inc., Reno, NV (US)

( * ) Notice: Subject to any disclaimer, the term of this patent is extended or adjusted under 35 U.S.C. 154(b) by 1323 days.

(21) Appl. No.: 12/751,212

(22) Filed: Mar. 31, 2010

(51) Int. Cl.
*H05K 7/20* (2006.01)

(52) U.S. Cl.
CPC ..... *H05K 7/20709* (2013.01); *H05K 7/20145* (2013.01); *H05K 7/20536* (2013.01)

(58) Field of Classification Search
CPC ...... H05K 7/20; H05K 7/20709; H05K 7/207; H05K 7/20145; H05K 7/20536; G06F 1/20
USPC ........... 454/184; 361/695, 689–690; 137/597
See application file for complete search history.

(56) References Cited

U.S. PATENT DOCUMENTS

| | | |
|---|---|---|
| 3,481,485 A | 12/1969 | Hess |
| 3,807,572 A | 4/1974 | Luvara et al. |
| 3,834,423 A | 9/1974 | Elson |
| 3,915,477 A | 10/1975 | Timmons |
| 4,082,092 A | 4/1978 | Foster |
| 4,328,897 A | 5/1982 | Weiss |
| 4,448,111 A | 5/1984 | Doherty |
| 4,585,122 A | 4/1986 | Stegenga |
| 4,864,469 A | 9/1989 | Boudon |
| 4,926,291 A | 5/1990 | Sarraf |
| 5,208,722 A | 5/1993 | Ryan et al. |
| 5,294,049 A | 3/1994 | Trunkle et al. |
| 5,412,534 A | 5/1995 | Cutts et al. |
| 5,473,507 A | 12/1995 | Schwegler et al. |
| 5,506,750 A | 4/1996 | Carteau et al. |
| 5,518,277 A | 5/1996 | Sanders |
| 5,621,890 A | 4/1997 | Notarianni et al. |
| 5,644,472 A | 7/1997 | Klein |
| 5,682,289 A | 10/1997 | Schwegler et al. |
| 5,751,549 A | 5/1998 | Eberhardt et al. |
| 5,772,500 A | 6/1998 | Harvey et al. |
| 5,796,580 A | 8/1998 | Komatsu et al. |
| 5,806,438 A | 9/1998 | Beaudet |
| 5,822,184 A | 10/1998 | Rabinovitz |
| 5,843,131 A | 12/1998 | McDonough |
| 5,871,396 A | 2/1999 | Shen |
| 6,031,717 A | 2/2000 | Baddour et al. |

(Continued)

FOREIGN PATENT DOCUMENTS

| | | |
|---|---|---|
| EP | 0 546 211 | 6/1993 |
| EP | 0 741 269 | 11/1996 |

(Continued)

OTHER PUBLICATIONS

U.S. Appl. No. 11/535,180.

(Continued)

*Primary Examiner* — Steven B McAllister
*Assistant Examiner* — Ko-Wei Lin
(74) *Attorney, Agent, or Firm* — Robert C. Kowert; Meyertons, Hood, Kivlin, Kowert & Goetzel, P.C.

(57) ABSTRACT

An air directing device includes a rack-coupling portion that couples the air directing device with a rack, and one or more air directing portions. The air directing portions include one or more openings and one or more scoops that direct air from outside the rack into at least one of the openings when the air directing device is coupled to the rack.

29 Claims, 8 Drawing Sheets

(56) References Cited

U.S. PATENT DOCUMENTS

| | | | |
|---|---|---|---|
| 6,039,190 A | 3/2000 | Clausen | |
| 6,141,986 A | 11/2000 | Koplin | |
| 6,154,368 A * | 11/2000 | Scofield | 361/719 |
| 6,166,917 A | 12/2000 | Anderson | |
| 6,259,605 B1 | 7/2001 | Schmitt | |
| 6,364,009 B1 * | 4/2002 | MacManus et al. | 165/185 |
| 6,425,417 B1 | 7/2002 | Paschke | |
| 6,456,498 B1 | 9/2002 | Larson et al. | |
| 6,459,579 B1 | 10/2002 | Farmer et al. | |
| 6,469,899 B2 | 10/2002 | Hastings et al. | |
| 6,496,366 B1 | 12/2002 | Coglitore et al. | |
| 6,499,609 B2 | 12/2002 | Patriche et al. | |
| 6,525,936 B2 * | 2/2003 | Beitelmal et al. | 361/695 |
| 6,535,382 B2 * | 3/2003 | Bishop et al. | 361/690 |
| 6,563,704 B2 * | 5/2003 | Grouell et al. | 361/679.33 |
| 6,590,768 B1 | 7/2003 | Wiley | |
| 6,603,661 B2 | 8/2003 | Smith et al. | |
| 6,621,693 B1 | 9/2003 | Potter et al. | |
| 6,625,020 B1 | 9/2003 | Hanson et al. | |
| 6,650,535 B1 | 11/2003 | Moss et al. | |
| 6,672,955 B2 * | 1/2004 | Charron | 454/184 |
| 6,754,082 B1 | 6/2004 | Ding et al. | |
| 6,767,280 B1 | 7/2004 | Berger | |
| 6,791,836 B2 | 9/2004 | Cipolla et al. | |
| 6,795,314 B1 | 9/2004 | Arbogast et al. | |
| 6,804,123 B1 | 10/2004 | Cheng | |
| 6,819,567 B2 | 11/2004 | Baker et al. | |
| 6,833,995 B1 | 12/2004 | Hsue et al. | |
| 6,859,366 B2 | 2/2005 | Fink et al. | |
| 6,960,130 B2 | 11/2005 | Gebke et al. | |
| 7,003,966 B2 | 2/2006 | Sharma et al. | |
| 7,010,392 B2 | 3/2006 | Bash et al. | |
| 7,031,154 B2 | 4/2006 | Bash et al. | |
| 7,035,111 B1 | 4/2006 | Lin et al. | |
| 7,042,722 B2 | 5/2006 | Suzuki et al. | |
| 7,068,505 B2 | 6/2006 | Kosugi | |
| 7,112,131 B2 * | 9/2006 | Rasmussen et al. | 454/184 |
| 7,197,433 B2 | 3/2007 | Patel et al. | |
| 7,238,104 B1 | 7/2007 | Greenslade et al. | |
| 7,257,956 B2 | 8/2007 | Shimada et al. | |
| 7,272,001 B2 | 9/2007 | Cheng | |
| 7,278,273 B1 | 10/2007 | Whitted et al. | |
| 7,283,358 B2 | 10/2007 | Campbell et al. | |
| 7,346,913 B2 | 3/2008 | Ishimine et al. | |
| 7,361,081 B2 | 4/2008 | Beitelmal et al. | |
| 7,379,299 B2 | 5/2008 | Walsh et al. | |
| 7,403,385 B2 | 7/2008 | Boone et al. | |
| 7,408,775 B2 | 8/2008 | Walz et al. | |
| 7,434,413 B2 | 10/2008 | Wruck | |
| 7,486,505 B2 | 2/2009 | Fushimi et al. | |
| 7,499,286 B2 | 3/2009 | Berke et al. | |
| 7,500,911 B2 | 3/2009 | Johnson et al. | |
| 7,542,288 B2 | 6/2009 | Lanus | |
| 7,660,116 B2 | 2/2010 | Claassen et al. | |
| 7,660,117 B2 | 2/2010 | Werner et al. | |
| 7,701,710 B2 | 4/2010 | Tanaka et al. | |
| 7,733,666 B2 | 6/2010 | Ichihara et al. | |
| 7,746,634 B2 | 6/2010 | Hom et al. | |
| 7,764,498 B2 | 7/2010 | Conn | |
| 7,768,780 B2 | 8/2010 | Coglitore et al. | |
| 7,768,787 B2 | 8/2010 | Vaughan et al. | |
| 7,804,685 B2 | 9/2010 | Krietzman | |
| 7,821,790 B2 | 10/2010 | Sharma et al. | |
| 7,843,685 B2 | 11/2010 | Beauchamp et al. | |
| 7,869,210 B2 | 1/2011 | Moss | |
| 7,878,888 B2 | 2/2011 | Rasmussen et al. | |
| 7,929,300 B1 | 4/2011 | Bisbikis et al. | |
| 7,944,700 B2 | 5/2011 | Wang et al. | |
| 7,990,700 B2 | 8/2011 | Guo | |
| 8,087,979 B2 | 1/2012 | Rasmussen | |
| 8,154,870 B1 | 4/2012 | Czamara et al. | |
| 2001/0029163 A1 | 10/2001 | Spinazzola et al. | |
| 2002/0021557 A1 | 2/2002 | Ishimine et al. | |
| 2002/0100736 A1 | 8/2002 | Lopez | |
| 2002/0134531 A1 | 9/2002 | Yanagida | |
| 2002/0181194 A1 | 12/2002 | Ho et al. | |
| 2003/0156385 A1 | 8/2003 | Askeland et al. | |
| 2004/0020224 A1 | 2/2004 | Bash et al. | |
| 2004/0032722 A1 | 2/2004 | Wrycraft et al. | |
| 2004/0165349 A1 * | 8/2004 | Arbogast et al. | 361/695 |
| 2004/0218355 A1 * | 11/2004 | Bash et al. | 361/690 |
| 2005/0135069 A1 | 6/2005 | King et al. | |
| 2005/0166860 A1 | 8/2005 | Austin et al. | |
| 2005/0188689 A1 | 9/2005 | Juby et al. | |
| 2005/0228618 A1 | 10/2005 | Patel et al. | |
| 2005/0237716 A1 | 10/2005 | Chu et al. | |
| 2005/0257232 A1 | 11/2005 | Hidaka | |
| 2005/0265004 A1 | 12/2005 | Coglitore et al. | |
| 2005/0281014 A1 | 12/2005 | Carullo et al. | |
| 2006/0059937 A1 | 3/2006 | Perkins et al. | |
| 2006/0061955 A1 | 3/2006 | Imblum | |
| 2006/0250766 A1 | 11/2006 | Blaalid et al. | |
| 2006/0274496 A1 | 12/2006 | Lee et al. | |
| 2006/0290245 A1 | 12/2006 | Hidaka | |
| 2007/0053169 A1 | 3/2007 | Carlson et al. | |
| 2007/0058336 A1 | 3/2007 | Cheng | |
| 2007/0074525 A1 | 4/2007 | Vinson et al. | |
| 2007/0076369 A1 | 4/2007 | Chen et al. | |
| 2007/0101746 A1 | 5/2007 | Scholm et al. | |
| 2007/0159790 A1 | 7/2007 | Coglitore et al. | |
| 2007/0213000 A1 | 9/2007 | Day | |
| 2007/0217172 A1 | 9/2007 | Bisbikis et al. | |
| 2007/0223200 A1 | 9/2007 | Fujiya et al. | |
| 2007/0230119 A1 * | 10/2007 | Baldwin, Jr. | H05K 7/20563 361/690 |
| 2007/0240433 A1 | 10/2007 | Manole | |
| 2008/0013275 A1 | 1/2008 | Beckley et al. | |
| 2008/0029250 A1 | 2/2008 | Carlson et al. | |
| 2008/0037209 A1 | 2/2008 | Niazi et al. | |
| 2008/0043427 A1 | 2/2008 | Lee et al. | |
| 2008/0055846 A1 | 3/2008 | Clidaras et al. | |
| 2008/0094797 A1 | 4/2008 | Coglitore et al. | |
| 2008/0112127 A1 | 5/2008 | June et al. | |
| 2008/0158813 A1 | 7/2008 | Yin | |
| 2008/0191590 A1 | 8/2008 | Lin et al. | |
| 2008/0232064 A1 | 9/2008 | Sato et al. | |
| 2008/0259566 A1 | 10/2008 | Fried | |
| 2008/0285232 A1 | 11/2008 | Claassen et al. | |
| 2008/0305733 A1 | 12/2008 | Noteboom et al. | |
| 2009/0061755 A1 | 3/2009 | Calder et al. | |
| 2009/0086441 A1 | 4/2009 | Randall et al. | |
| 2009/0097200 A1 | 4/2009 | Sharma et al. | |
| 2009/0109609 A1 | 4/2009 | Lai et al. | |
| 2009/0122505 A1 | 5/2009 | Lu | |
| 2009/0237877 A1 | 9/2009 | Honda et al. | |
| 2009/0257187 A1 | 10/2009 | Mills et al. | |
| 2009/0260384 A1 | 10/2009 | Champion et al. | |
| 2009/0296322 A1 | 12/2009 | Yang et al. | |
| 2009/0321105 A1 | 12/2009 | Sawyer | |
| 2010/0024445 A1 | 2/2010 | Cichanowicz | |
| 2010/0091458 A1 | 4/2010 | Mosier et al. | |
| 2010/0149754 A1 | 6/2010 | Chapel et al. | |
| 2010/0271766 A1 | 10/2010 | Lin | |
| 2011/0149508 A1 | 6/2011 | Malekmadani | |
| 2011/0284422 A1 | 11/2011 | Yamada | |
| 2012/0092811 A1 | 4/2012 | Chapel et al. | |

FOREIGN PATENT DOCUMENTS

| | | |
|---|---|---|
| EP | 0741269 | 11/1996 |
| EP | 2 053 911 | 4/2009 |
| EP | 2053911 | 4/2009 |
| EP | 2202751 | 6/2010 |
| JP | 2010-86450 | 4/2010 |
| WO | 98/34450 | 8/1998 |
| WO | 9834450 | 8/1998 |
| WO | 2008/143503 | 11/2008 |
| WO | 2008143503 | 11/2008 |

OTHER PUBLICATIONS

U.S. Appl. No. 12/341,137, filed Dec. 28, 2008.
U.S. Appl. No. 11/956,849, filed Dec. 14, 2007.

(56) References Cited

OTHER PUBLICATIONS

U.S. Appl. No. 12/163,146, filed Jun. 27, 2008.
U.S. Appl. No. 12/646,417, filed Dec. 23, 2009.
U.S. Appl. No. 12/751,209, filed Mar. 31, 2010.
U.S. Appl. No. 12/751,206, filed Mar. 31, 2010, Michael W. Schrempp.
U.S. Appl. No. 12/751,209, filed Mar. 31, 2010, Michael P. Czamara.
U.S. Appl. No. 12/163,146, filed Jun. 27, 2008, Osvaldo P. Morales.
U.S. Appl. No. 12/893,813, filed Sep. 29, 2010, Richard C. Towner.
U.S. Appl. No. 11/535,180, filed Sep. 26,2006, Osvaldo P. Morales.
U.S. Appl. No. 12/886,437, filed Sep. 20, 2010, Peter G. Ross.
U.S. Appl. No. 12/886,472, filed Sep. 20, 2010, Peter G. Ross.
U.S. Appl. No. 12/886,469, filed Sep. 20, 2010, Peter G. Ross.
U.S. Appl. No. 11/956,849, filed Dec. 14, 2007, Osvaldo P. Morales.
U.S. Appl. No. 12/646,417, filed Dec. 23, 2009, Michael P. Czamara.
U.S. Appl. No. 12/341,137, filed Dec. 28, 2008, Jonathan David Hay.
U.S. Appl. No. 121751,212, filed Mar. 31, 2010, Michael P. Czamara.
U.S. Appl. No. 12/886,440, filed Sep. 20, 2010, Peter GRoss et al.
U.S. Appl. No. 13/103,860, filed May 9, 2011, Michael P. Czamara.

* cited by examiner

RACK-MOUNTED AIR DIRECTING DEVICE WITH SCOOP

BACKGROUND

Organizations such as on-line retailers, Internet service providers, search providers, financial institutions, universities, and other computing-intensive organizations often conduct computer operations from large scale computing facilities. Such computing facilities house and accommodate a large amount of server, network, and computer equipment to process, store, and exchange data as needed to carried out an organization's operations. Typically, a computer room of a computing facility includes many server racks. Each server rack, in turn, includes many servers and associated computer equipment.

Computer systems typically include a number of components that generate waste heat. Such components include printed circuit boards, mass storage devices, power supplies, and processors. For example, some computers with multiple processors may generate 250 watts of waste heat. Some known computer systems include a plurality of such larger, multiple-processor computers that are configured into rack-mounted components, and then are subsequently positioned within a rack system. Some known rack systems include 40 such rack-mounted components and such rack systems will therefore generate as much as 10 kilowatts of waste heat. Moreover, some known data centers include a plurality of such rack systems.

Some known data centers include methods and apparatus that facilitate waste heat removal from rack systems. Moreover, some known data centers include a multiple rack systems having configurations that are non-uniform with respect to component density and usage, such that each rack system generates waste heat at a non-uniform rate as compared to other rack systems. In such data centers, application of uniform heat removal methods and apparatus to such non-uniform waste heat generation sources may not be fully efficient and effective in waste heat removal. Moreover, some such data centers rely on servers fans to produce airflow through the servers in the racks. Such fans may, however, add to the costs and complexity of the servers, and, in addition, may be inefficient and prone to failure.

Figure 1:
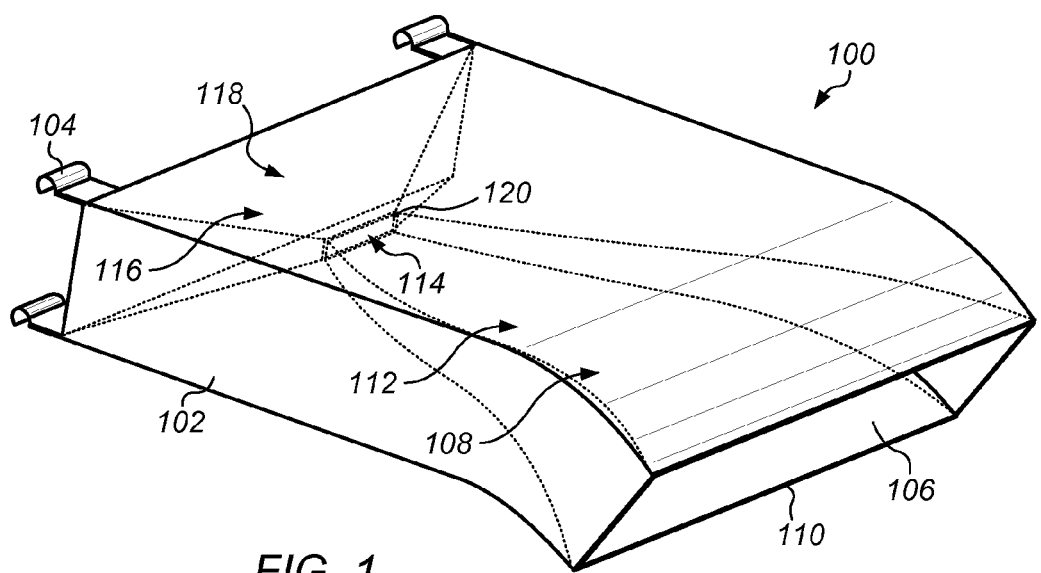
FIG. 1 illustrates one embodiment of an air directing device including a scoop for receiving air into a rack system.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims. The headings used herein are for organizational purposes only and are not meant to be used to limit the scope of the description or the claims. As used throughout this application, the word "may" is used in a permissive sense (i.e., meaning having the potential to), rather than the mandatory sense (i.e., meaning must). Similarly, the words "include," "including," and "includes" mean including, but not limited to.

DETAILED DESCRIPTION OF EMBODIMENTS

Various embodiments of air directing devices, and systems and methods using air directing devices, are disclosed. According to one embodiment, an air directing device includes a rack-coupling portion that couples the air directing device with a rack, and one or more air directing portions. The air directing portions include one or more openings and one or more scoops that direct air into at least one of the openings when the air directing device is coupled to the rack. The air directing portions may increase the velocity of at least a portion of the air in the air directing portions.

According to one embodiment, a system for removing heat from rack-mounted computer systems in a computer room includes one or more air handling systems and one or more air directing devices. The air handling systems supply air to one or more rack systems in the computer room. The air directing devices are coupled to at least one of the rack systems. The air directing devices include one or more rack coupling portions and one or more air directing portions. The air directing portions include one or more openings and one or more scoops that direct air into at least one of the openings.

According to one embodiment, a method of cooling rack-mounted computer systems in a computer room includes coupling an air directing device having a scoop to one or more rack systems in the computer room. Air is directed through scoop of the air directing devices and into or out of the rack system. The velocity of at least a portion of the air is increased as the air passes through the air directing device.

As used herein, "air handling system" means a system that provides or moves air to, or removes air from, one or more systems or components.

As used herein, an "aisle" means a space next to one or more racks.

As used herein, "ambient" means, with respect to a system or facility, the air surrounding at least a portion of the system or facility. For example, with respect to a data center, ambient air may be air outside the data center, for example, at or near an intake hood of an air handling system for the data center.

As used herein, "computing" includes any operations that can be performed by a computer, such as computation, data storage, data retrieval, or communications.

As used herein, "computer system" includes any of various computer systems or components thereof. One example of a computer system is a rack-mounted server. As used herein, the term computer is not limited to just those integrated circuits referred to in the art as a computer, but broadly refers to a processor, a server, a microcontroller, a microcomputer, a programmable logic controller (PLC), an application specific integrated circuit, and other programmable circuits, and these terms are used interchangeably herein. In the various embodiments, memory may include, but is not limited to, a computer-readable medium, such as a random access memory (RAM). Alternatively, a compact disc-read only memory (CD-ROM), a magneto-optical disk (MOD), and/or a digital versatile disc (DVD) may also be used. Also, additional input channels may include computer peripherals associated with an operator interface such as a mouse and a keyboard. Alternatively, other computer peripherals may also be used that may include, for example, a scanner. Furthermore, in the some embodiments, additional output channels may include an operator interface monitor and/or a printer.

As used herein in the context of a fluid passage, "converging" means that the cross sectional area of the path is decreasing in the direction of the flow.

As used herein, "data center" includes any facility or portion of a facility in which computer operations are carried out. A data center may include servers dedicated to specific functions or serving multiple functions. Examples of computer operations include information processing, communications, testing, simulations, power distribution and control, and operational control.

As used herein, "data center module" means a module that includes, or is suitable for housing and/or physically supporting, one or more computer systems that can provide computing resources for a data center.

As used herein in the context of a fluid passage, "diverging" means that the cross sectional area of the path is increasing in the direction of the flow.

As used herein, a "duct" includes any device, apparatus, element, or portion thereof, that can direct, segregate, or channel a fluid, such as air. Examples of ducts include cloth or fabric ducts, sheet metal ducts, molded ducts, tubes, or pipes. The cross sectional shape of a passageway of a duct may be square, rectangular, round or irregular, and may be uniform or change over the length of the duct. A duct may be a separately produced component or integral with one or more other components, such as a frame.

As used herein, a "free cooling" includes operation in which an air handling system pulls air at least partially from an external source (such as air outside a facility) and/or a return from a computer room, and forces the air to electronic equipment without active chilling in the air-handling subsystem.

As used herein, a "module" is a component or a combination of components physically coupled to one another. A module may include functional elements and systems, such as computer systems, racks, blowers, ducts, power distribution units, fire suppression systems, and control systems, as well as structural elements, such a frame, housing, or container. In some embodiments, a module is pre-fabricated at a location off-site from a data center.

As used herein, a "rack" means a rack, container, frame, or other element or combination of elements that can contain or physically support one or more computer systems.

As used herein, a "pin" includes any element that can be positioned to constrain or hold another element in a desired position or orientation. Suitable pins may include straight pins, pegs, threaded bolts, unthreaded bolts, bars, plates, hooks, rods, or screws.

As used herein, "room" means a room or a space of a building. As used herein, "computer room" means a room of a building in which computer systems, such as rack-mounted servers, are operated.

As used herein, "scoop" means an element, or portion thereof, that can collect, channel, receive, or direct a fluid into a passage.

As used herein, a "space" means a space, area or volume.

FIG. 1 illustrates one embodiment of an air directing device including a scoop for receiving air into a rack system. Air directing device 100 includes body 102 and clips 104. Body 102 includes scoop 106. Scoop 106 defines the leading part of passage 108. Passage 108 runs through body 102. Passage 108 includes mouth 110, converging section 112, throat 114, diverging section 116, and rear opening 118. Metering plate 120 is provided in throat 112.

Figure 2:
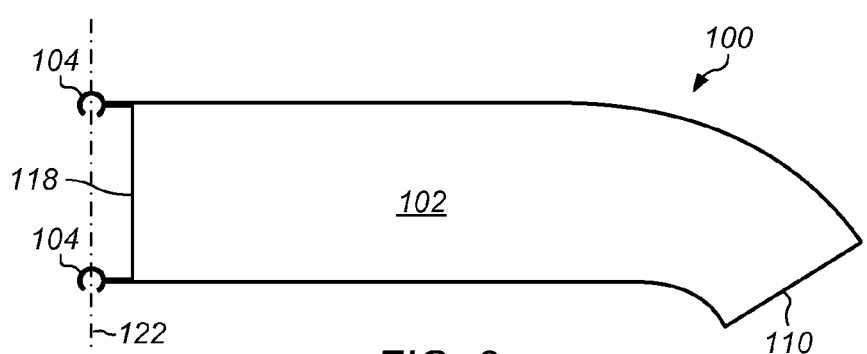
FIG. 2 is a side view of the air directing device shown in FIG. 1.

FIG. 2 is a side view of the air directing device shown in FIG. 1. Clips 104 may define rack-mounting plane 122. Rack-mounting plane may be a vertical plane that is perpendicular to a rack when air directing device 100 is coupled to the rack. As is illustrated in FIG. 1, scoop 106 may open partially outwardly and partially downwardly with respect to rack-mounting plane 122. Scoop 106 may be oriented at an angle relative to vertical mounting plane. A scoop may open at various other orientations, however. For example, in one embodiment, a scoop is oriented to face straight down. In another embodiment, a scoop is oriented to face straight up.

Although in FIG. 1, passage 108 is shown with a converging section followed by a diverging section, a passage of an air directing device may have various different shapes and forms. In one embodiment, a passage may be converging over the entire length of the passage, for example. In another embodiment, a passage may have a uniform cross section over the length of the passage. As is illustrated in FIG. 1, a scoop may define a converging section in a passage.

Although in FIG. 1, air directing device includes only one passage, in various embodiments, an air directing device may have more than one passage.

Clips 104 may serve as rack-coupling portions for air directing device 100. In one embodiment, clips 104 couple with a horizontal bar on a rack. Various other elements may be included for coupling an air directing device to a rack, however. Suitable mounting elements may include hooks, pins, hook and loop, snaps, screws, clips, or other fasteners.

Figure 3:
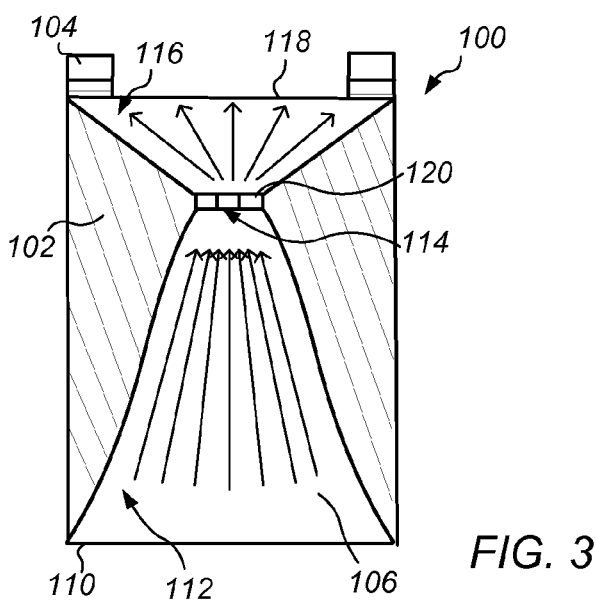
FIG. 3 is a schematic cross sectional view of the air directing device shown in FIG. 1.

FIG. 3 is a schematic cross sectional view of the air directing device shown in FIG. 1. In one embodiment, for at least a portion converging section 112, the cross sectional area of the passage may decrease exponentially in the direction of flow. Thus, for example, the portion of the passage 108 defined by scoop 106 may fan out near mouth 110. In other embodiments, the cross sectional area of the passage may decrease linearly in the direction of flow. Air may pass out of converging section 112, through an opening in metering plate 120, and into diverging section 116.

As air passes through converging section 112, the velocity of the air in the passage may increase. Air in passage 108 may expand as it passes through diverging section 116. In some embodiments, the air may cool as it expands through a diverging section of a passage. In certain embodiments, a passage in an air directing device may create a Venturi effect.

In some embodiments, the flow of air through one or more passages in an air directing device is restricted. Restriction of air may occur over a portion of the length of a passage (such as a nozzle), at a specific point in the stream of air (at an orifice plate), or a combination of both. For example, converging section 112 may restrict the flow of air through passage 108. Metering plate 120 may also restrict the flow of air through passage 108.

Figure 4A:
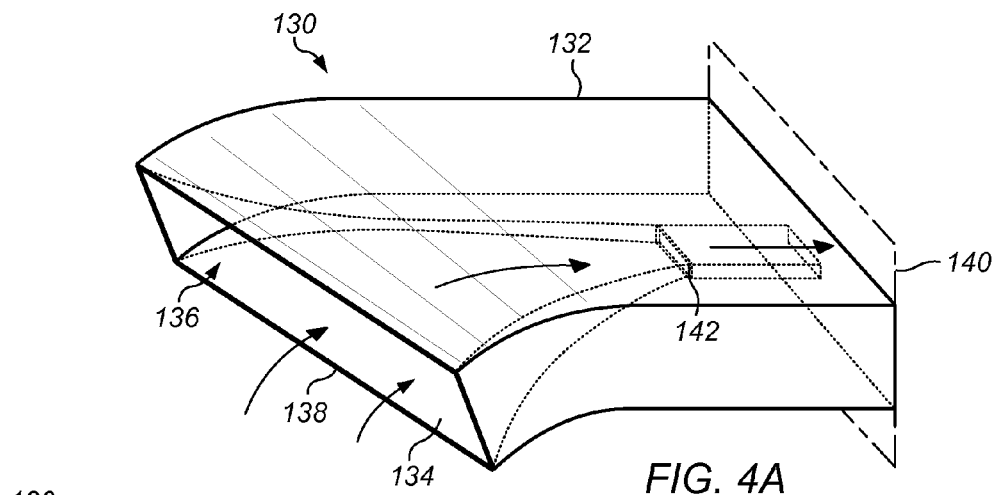
FIG. 4A illustrates an embodiment of an air directing device having a scoop with a converging passage.

In some embodiments, an air directing device may increase a velocity of air flowing into a rack system. In certain embodiments, an air directing device may enhance convective cooling of heat producing components in a rack. FIG. 4A illustrates an embodiment of an air directing device having a converging passage. Air directing device 130 includes body 132, scoop 134, passage 136, and passage 137. Passage 136 includes mouth 138 and exit 139. Mouth 138 is oriented obliquely with respect to rack-mounting plane 140, such that mouth 138 open partially downwardly, partially outwardly, and partially to the side. The cross sectional area of exit 139 may be less than the cross sectional area of mouth 138. The velocity of the air at exit 139 may be greater than the velocity of air entering at mouth 138. In certain embodiments, turbulence may be increased in an air passing as it passes through a passage in an air directing device.

In the embodiment shown in FIG. 4A, exit 139 is centered with respect to the top, bottom, and sides of body 132, and passage 137 points directly to the rear of air directing device 130. In other embodiments, however, exit 139 and passage 137 may be arranged to direct air to a different location in the rack. For example, exit 139 may be located near the left side of air directing device 130. As another example, passage 137 may be slanted from right to left, or from top to bottom.

Figure 4B:
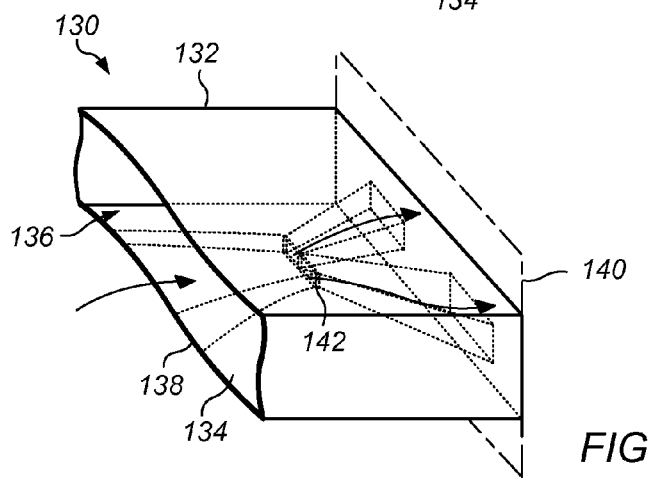
FIG. 4B illustrates an embodiment of an air directing device having two air outlets.

In some embodiments, an air directing device may have multiple air outlets. FIG. 4B illustrates a portion of an air directing device having multiple outlets according to one embodiment. Air directing device 141 includes passage 136, throat 143, passage 144, and passage 145. Air passes into passage 136 and flows to mouth 143, then divides into multiple streams: one stream through passage 144 and another stream through passage 145. Air from passage 144 exits through exit 146. Air from passage 145 exits through exit 147. Passage 144 may have a different size and/or shape from passage 145. Exit 146 may have a different cross sectional area than that of exit 147. Thus, characteristics of the air (quantity of air, velocity, pressure, etc.) flowing from exit 146 and exit 147 may be different. In certain embodiments, the location, size, and other characteristics of air passages and outlets of an air directing device may be chosen to target cooling air to desired locations of a rack or server. In certain embodiments, different passages or openings in an air directing device may be tuned with metering plates.

Although in the embodiment shown in FIG. 4B, a single air inlet communicates with two air outlets, various other arrangements of inlets and outlets may be included in an air directing device. An air directing device may have any number of air inlets and air outlets. For example, an air directing device may have two or more inlets, each communicating with a separate air outlet. As another example, an air directing device may have multiple air inlets communicating with a single air outlet.

Figure 5A:
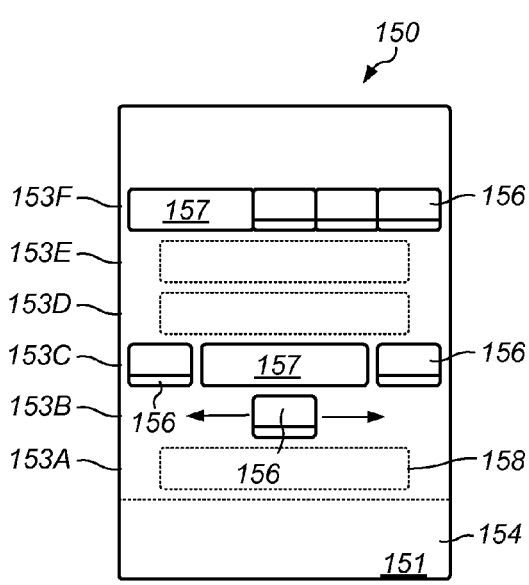
FIG. 5A illustrates a schematic front view of a rack system that includes air directing devices with scoops for receiving air into the rack system.
Figure 5B:
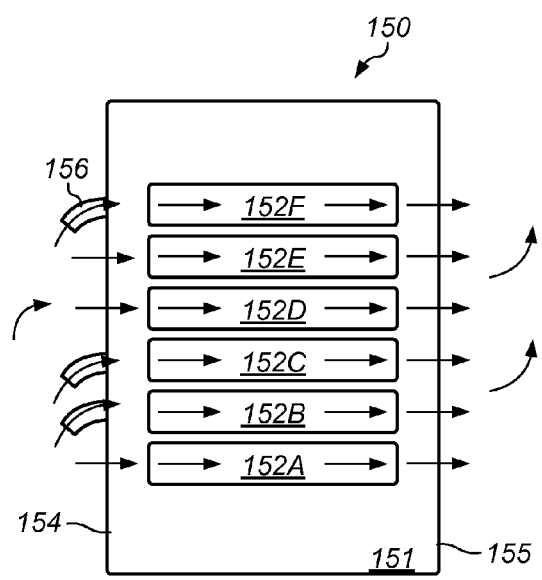
FIG. 5B illustrates a schematic side view of a rack system that includes air directing devices with scoops for receiving air into the rack system.

FIG. 5A illustrates a schematic front view of a rack system that includes air directing devices with scoops for receiving air into the rack. FIG. 5B illustrates a schematic side view of a rack system that includes air directing devices with scoops for receiving air into the rack. Rack system 150 includes rack 151 and computer systems 152A, 152B, 152C, 152D, 152E, and 152F, which are located in corresponding slots 153A, 153B, 153C, 153D, 153E, and 153F. Rack system 150 includes front side 154 and back side 155.

Air directing devices 156 are coupled to rack 151 on front side 154. In one embodiment, air directing devices 156 are similar to air directing device 100 described above relative to FIG. 1. Air directing devices 156 may direct and/or boost the flow of air across one or more of computer systems 152A-152F. Blanking plates 157 are provided in slots 153C and 153F on front side 154 of rack system 150. Vents 158 are provided in slots 153A, 153D, and 153E to allow air to flow into rack 151 at the slot.

In some embodiments, the location of air directing devices may differ from slot-to-slot of a rack system. The locations of air directing device may be based on the cooling requirements of the computer systems in the rack. In some embodiments, air directing devices are provided for computer systems in relatively warm locations in a rack to enhance cooling of such computer systems. For example, in slot 153F near the top of rack system 150, three air directing devices 156 are provided because computer system 153F may be in a relatively warm location in the rack. Conversely, in slot 153A, no air directing devices may be needed because the air in this lower slot in the rack may be relatively cool.

In some embodiments, air directing devices are located to direct air to desired locations in a particular server. The desired location may be based on the layout of heat producing components of the server. In certain embodiments, an air directing device is placed at desired location along the width of a slot in which the rack is installed. For example, for a type of server that has a central processing unit on the right side and disk drives on the left side, one or more air directing devices may be positioned on the right side of the slot, such as in slot 153F shown in FIG. 5A. As another example, for a type of server that has sensitive electronic components on the right side and left side of the server and disk drives in the middle, one or more air directing devices may be positioned on each of the left side and right side of the slot, such as in slot 153C shown in FIG. 5A.

In various embodiments, different air directing devices (for example, having different sized or shaped passages, orifices, or scoops), may be used in different locations, depending on cooling requirements of the computer systems in the rack. For example, an air directing device for a low power server may have a relatively small scoop and a relatively small orifice, while an air directing device for a high power server may have a relatively large scoop and a relatively large orifice. In some embodiments, the size and/or position of an opening in an air directing device may match the size of a corresponding opening in a server. In one embodiment, an opening in an air directing device is about 3.5 inches across.

In certain embodiments, an air directing device may be movable on a rack. In one embodiment, an air directing device slides on a rail on the front of a rack. For example, the air directing device 156 shown in slot 153B in FIG. 5A may be moved to the left or right within slot 153B.

An air handling system may produce static pressure on front side 168 of rack system 150 relative to back side 170 of rack system 150. In one embodiment, the static pressure is about 0.1 inches of water. During operation, air may be forced from the front to the back of rack system 150. In certain embodiments, flow through a rack may be provided using compressed air.

In some embodiments, some or all of servers in rack system 150 include internal fans. The internal fans may promote the flow of air through the rack. In other embodiments, none of the servers in a rack have internal fans.

Figure 6:
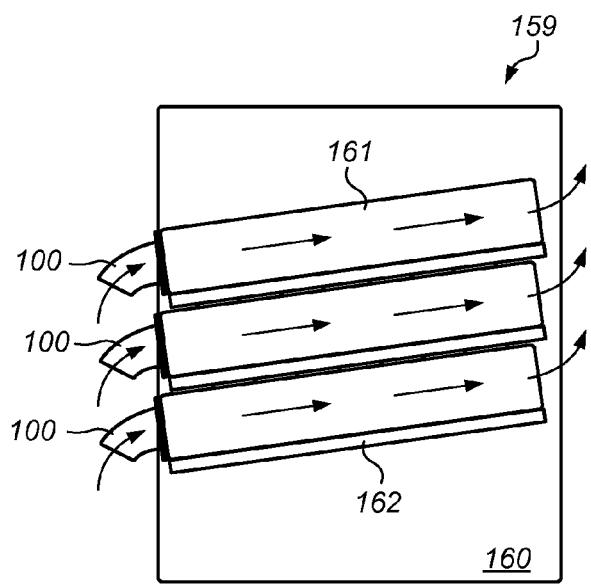
FIG. 6 illustrates a schematic side view of a rack system including intake air directing devices and computer systems in an upwardly slanting orientation.

FIG. 6 illustrates a schematic side view of a rack system including intake air directing devices and computer systems in an upwardly slanting orientation according to one embodiment. System 159 includes rack 160 and computer systems 161. Rack 160 includes rails 162. Rails 162 may slant upward from front to back of rack 160. In one embodiment, the slant is about 45 degrees. Air may flow through into the front of rack 160 through air directing device 100, through computer systems 161, and exit at the rear of rack 160. Upward slant of computer systems 161 may promote airflow through computer systems 161, for example, by promoting natural convection of the air flowing across the computer systems.

Figure 7:
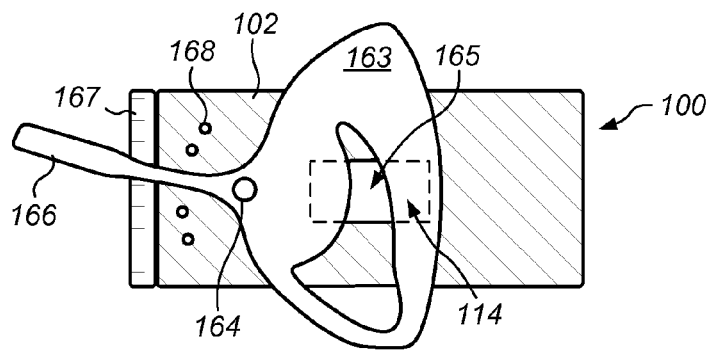
FIG. 7 illustrates one embodiment of an air directing device including a continuous aperture adjustment mechanism.

In some embodiments, an air directing device may include a mechanism for adjusting an aperture of a passage through the air directing device. FIG. 7 illustrates one embodiment of an air directing device including an aperture adjustment mechanism. Aperture plate 163 is pivotally coupled to body 102 of air directing device 100 on pin 164. Aperture plate 163 includes aperture 165 and lever 166. Aperture 165 may overlay throat 114 in body 102. By adjusting the position of aperture plate 163 using lever 166, the size of the effective opening through the passage may be established and adjusted. In some embodiments, indicator 167 guides a user in setting the effective opening. Detents 168 allow aperture plate 163 to be set at discrete positions.

In some embodiments, an effective aperture may be set based on the type of server for which the air directing device is being used. For example, for one type of server, the effective aperture may be set to a relatively large size, while for another type of server, the effective aperture may be set to a relatively small size.

Figure 8:
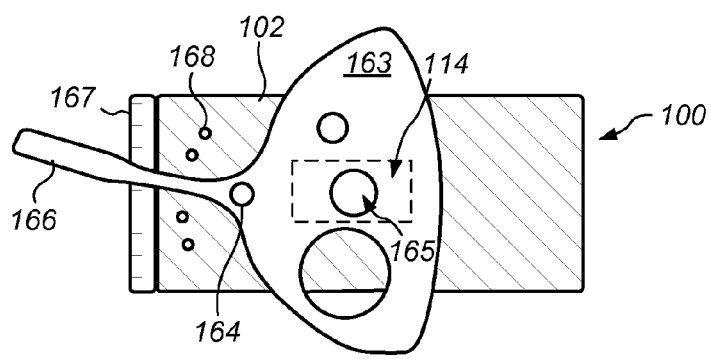
FIG. 8 illustrates one embodiment of an air directing device including a discrete aperture adjustment mechanism.

FIG. 8 illustrates one embodiment of an air directing device including a discrete aperture adjustment mechanism. Aperture plate 163 includes a series of apertures 165. Each of apertures 165 is a different size. In one embodiment, each aperture corresponds to a different type of server.

An air directing device, and portions thereof, may be produced by various manufacturing processes, including molding, casting, machining, extruding, or cutting. In one embodiment, an air directing device is injection molded. Suitable materials for an air directing device may include a polymer or a metal. In some embodiments, an air directing device is produced as a single part, such as by molding, forming, or machining. In other embodiments, an air directing device is an assembly of two or more parts.

Figure 9A:
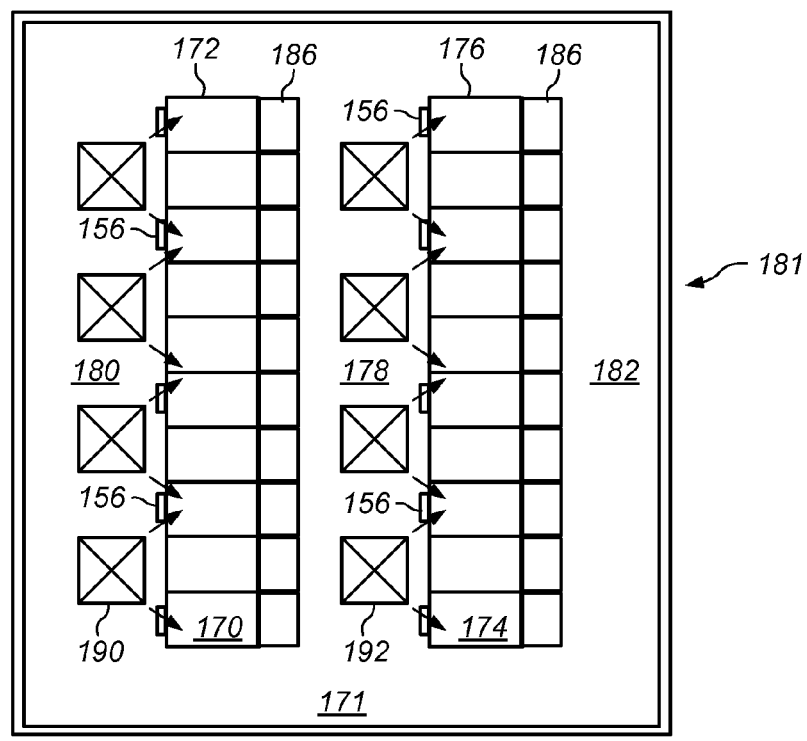
FIG. 9A is a schematic top view illustrating one embodiment of a data center including rows of rack systems with air directing devices.
Figure 9B:
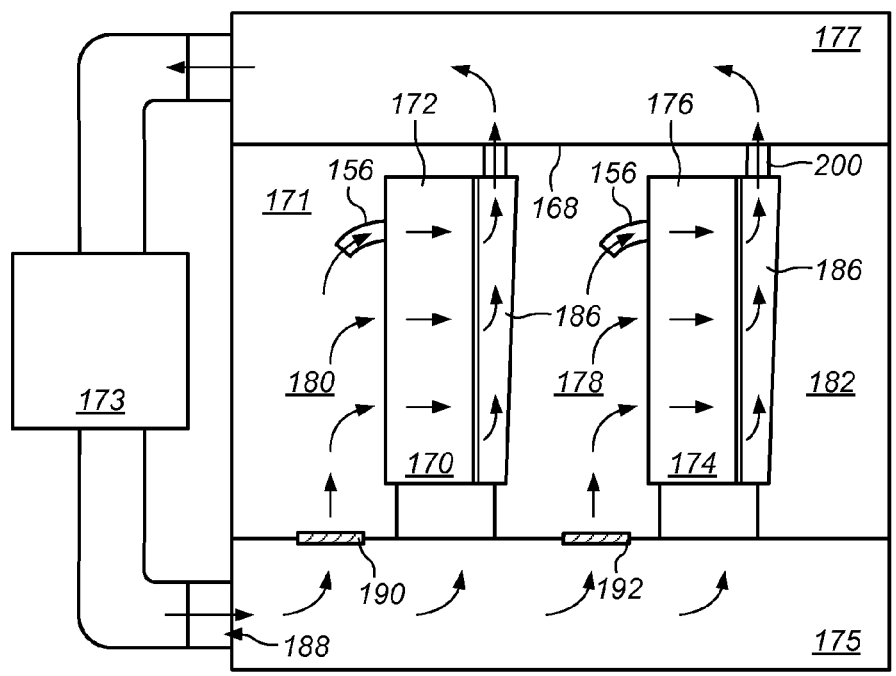
FIG. 9B is a schematic end view illustrating one embodiment of a data center including rows of rack systems with air directing devices.

In some embodiments, a data center having multiple rack systems includes air directing devices on some or all of the rack systems. The air directing devices may segregate air entering or exiting some of the rack systems from air spaces in the data center and/or air passing through other rack systems in the data center. In some embodiments, an air directing device segregates air exiting a rack system in a row of rack systems from air in an aisle adjacent to the row. FIG. 9A illustrates a schematic top view of one embodiment of a data center including rows of rack systems with air directing devices. FIG. 9B illustrates a schematic end view of the data center shown in FIG. 9A. Data center 181 includes computer room 171, air handling system 173, subfloor chamber 165, and plenum 177. Plenum 177 is above ceiling 179 of computer room 162.

Computer room 171 includes rack systems 170 in row 172, and rack systems 174 in row 176. Aisle 178 is formed between rows 172 and row 176. Aisles 180 and 182 are formed between the walls of computer room 171 and rows 172 and 176, respectively. Rack systems 170 and 174 are provided with air directing devices 156 on the inlet side of the racks and air directing devices 186 on the exit side of the racks.

To remove heat from servers in rack systems 170 and 174, air handling system 173 may be operated to cause air to flow in computer room 171 and through rack systems 170 and 174. Air may be forced into sub floor chamber 165 through opening 188. Air from subfloor chamber 165 may pass into computer room 171 through vents 190 and 192. Air from vent 190 may flow into aisle 180. Air directing devices 156 may direct air into rack systems 170 through the front side of row 172. Air directing devices 156 may include scoops similar to those described above with respect to FIGS. 1-3 or FIG. 4. Air from vent 192 may flow into aisle 178. Air directing devices 156 may direct air into rack systems 174 through the front side of row 176. Air directing devices 156 may boost the flow of air through rack systems 170 and 174.

Air may flow through servers in rack systems 170 and 174 and into air directing devices 186. Heated air in air directing devices 186 may be channeled through connecting ducts 200 to plenum 177. Air directing devices 186 on rack systems 170 of row 172 may segregate heated air exiting rack systems 170 from the air in aisle 178. Segregating exit air from air in aisle 178 may avoid pre-heating of air entering rack systems 174 in adjacent row 176.

Figure 10A:
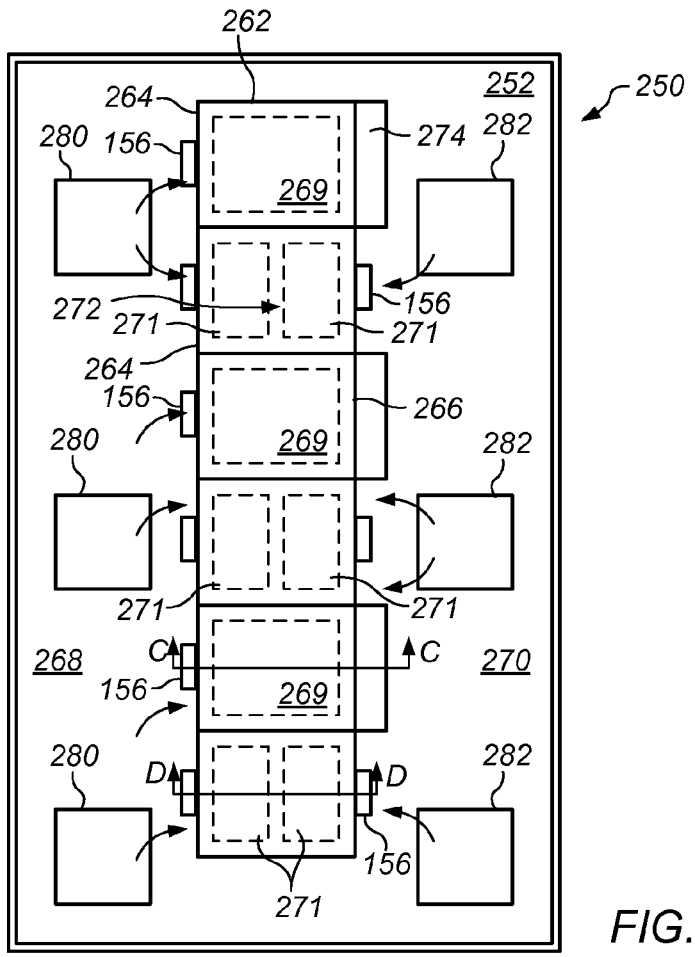
FIG. 10A a schematic top view illustrating one embodiment of a data center including a row of rack systems with two different airflow configurations.
Figure 10B:
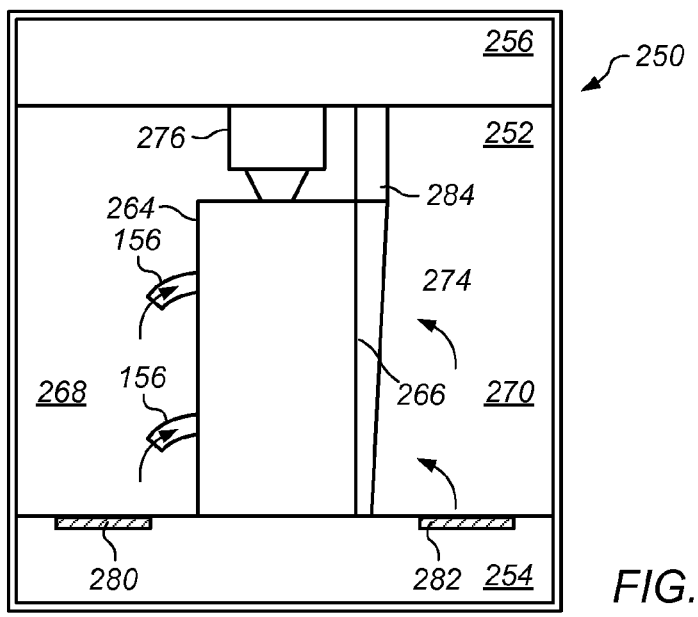
FIG. 10B a schematic end view illustrating one embodiment of a data center including a row of rack systems with two different airflow configurations.

In some embodiments, different rack systems in the same row have different airflow configurations. In certain embodiments, an air directing device segregates heated air exiting one rack system in a row from incoming air for other rack systems in the same row. FIG. 10A illustrates a schematic top view of one embodiment of a data center including a row of rack systems with two different airflow configurations. FIG. 10B illustrates a schematic end view of the data center shown in FIG. 10A. Data center 250 includes computer room 252, subfloor chamber 254, and plenum 256. Computer room 252 includes hot-cold rack systems 258 and cold-cold rack systems 260 in common row 262. In one embodiment, cold-cold rack system 260 is a half-depth server made by Rackable Systems, Inc. Row 262 includes front side 264 and back side 266. Row 262 separates front aisle 268 and back aisle 270.

Hot-cold rack systems 258 include full depth servers 269. Air directing devices 156 are coupled to hot-cold rack systems 258 at selected locations on the front sides of the of hot-cold rack systems 258. One of air directing devices 274 is coupled to each of hot-cold rack systems 258 on backside 266 of row 262. Servers 264 in hot-cold rack systems 258 are cooled by passing air from front to back of row 262.

Cold-cold rack systems 260 include half depth servers 271. In each cold-cold rack system 260, mid column 272 is provided or formed in the space between the front stack of half depth servers 271 and the back stack of half depth servers 271. Air directing devices 156 are coupled to cold-cold rack systems 260 at selected locations on both the front side and back sides of the cold-cold rack systems 260. One of ducts 276 is coupled to each of cold-cold rack systems 260 above mid column 272. Servers 269 in cold-cold rack systems 260 are cooled by drawing air into rack system 260 on both the front and back of the rack system, and removing the air from mid column 272 through duct 276.

To remove heat from servers 269 and 271, an air handling system may be operated to cause air to flow from subfloor 254 to computer room 252 through front aisle floor vents 280 and back aisle floor vents 282. Air from front aisle floor vents 280 may pass from front aisle 268 into hot-cold rack systems 258 and cold-cold rack systems 260. Some of the air from the aisles flows into racks through air directing devices 156. Air from back aisle floor vents 282 may pass from front aisle 270 into cold-cold rack systems 260. In one embodiment, the flow of air in the racks is about 450 cubic feet per minute per rack, per side.

Figure 10C:
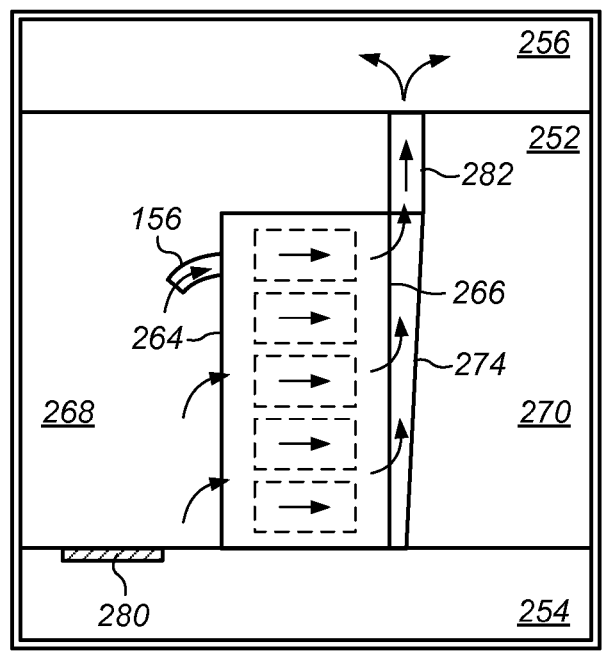
FIG. 10C illustrates removal of heat from computer systems in hot-cold rack systems.

The manner of removal of heated air from the rack systems in a row varies depending on the type of rack system. FIG. 10C illustrates removal of air from hot-cold rack systems shown in FIG. 10A. Air drawn from front aisle 268 passes through servers 269, out the back of the rack system, and into air directing device 274. Air directing device 274 may direct heated air from the rack system into duct 284. Duct 284 may channel the heated air into plenum 256. Air directing device 274 and/or duct 284 may segregate heated air from servers 268 from air in back aisle 270, thereby avoiding cross-heating of the cooling air for cold-cold rack systems 260 that would occur if air discharged from hot-cold rack systems 258 were to mix with the air in back aisle 270.

Figure 10D:
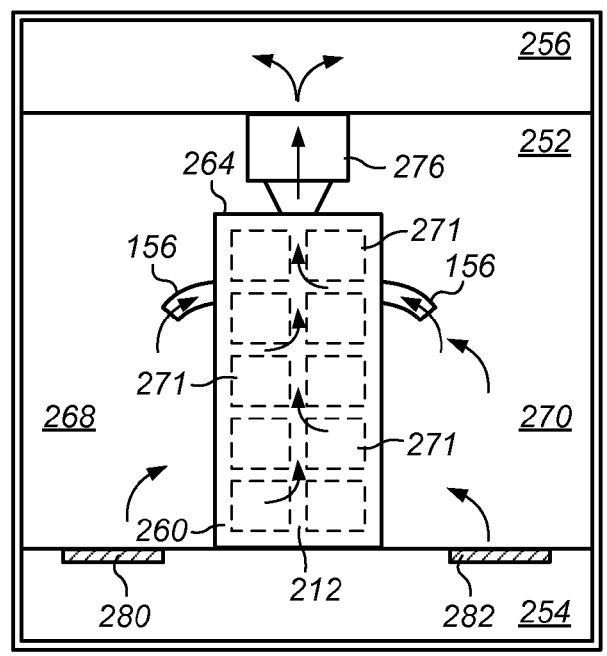
FIG. 10D illustrates removal of heat from computer systems in cold-cold rack systems.

FIG. 10D illustrates removal of air from cold-cold rack systems shown in FIG. 10A. Air flows from the front side and back side of rack systems 260 through half depth servers 271 to mid column 272. Air in mid column 272 passes into duct 276, and then into plenum 256.

Figure 11A:
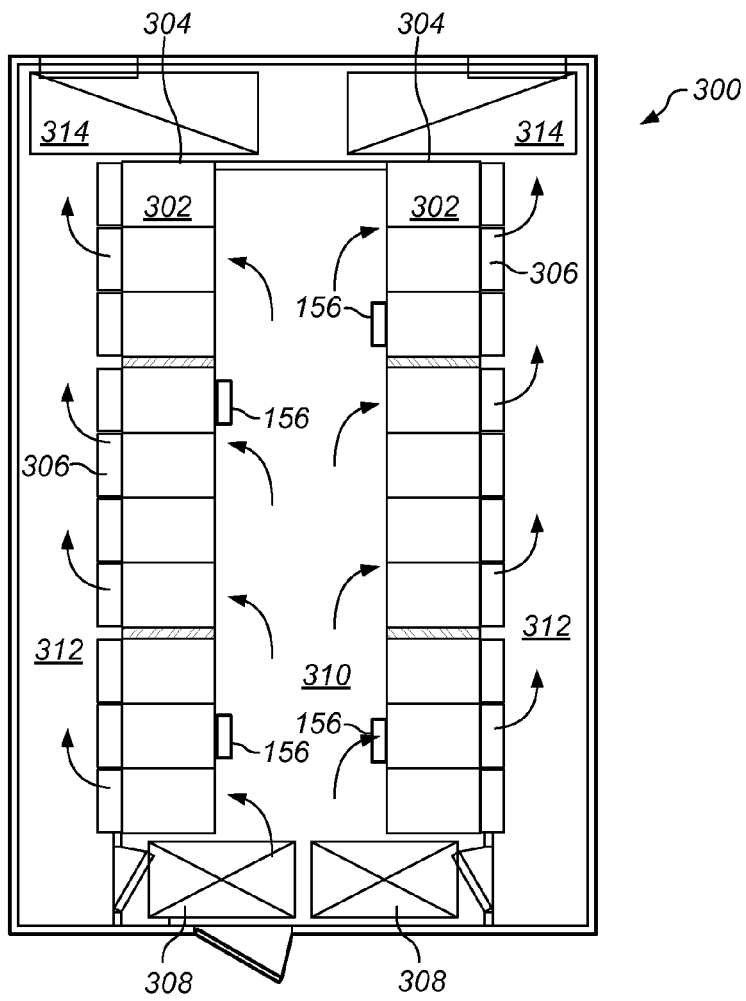
FIG. 11A is a schematic top view illustrating one embodiment of a data center including rack systems with a shared cold aisle.
Figure 11B:
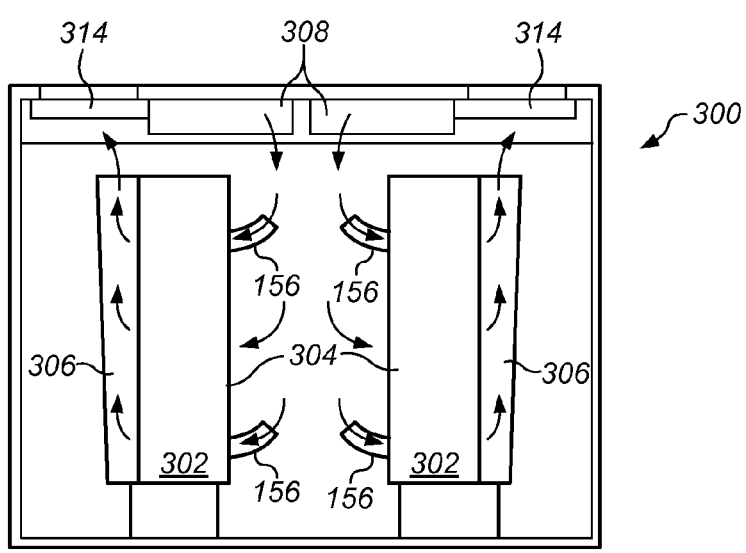
FIG. 11B is a schematic end view illustrating one embodiment of a data center including rack systems with a shared cold aisle.

In some embodiments of a data center, adjacent rows of a data center may receive cooling air from a shared aisle. FIG. 11A illustrates a schematic top view of one embodiment of a data center including rack systems with a shared aisle. FIG. 11B illustrates a schematic end view of the data center shown in FIG. 11A. Data center 300 includes rack systems 302 in rows 304. In one embodiment, a computer room of data center 300 is contained in a data center module. Air directing devices 306 are coupled to rack systems 302. Air directing devices 156 are coupled to rack systems 302 at selected locations on the front sides of rack systems 302. As shown in FIG. 11B, scoops on air directing devices 156 may face upwardly. Facing the scoops of air directing devices 156 upwardly may promote the flow of air into rack systems 302.

An air handling system causes air to flow from supply vents 308 and into center aisle 310. Air from center aisle 310 flows into rack systems 302. Some of the air from center aisle flows into racks through air directing devices 156. Air directing devices 306 direct air exiting from rack systems 302 out through the tops of air directing devices 306. Return air vents may draw air, including air discharged from air directing devices 306, out of data center 300.

Figure 12:
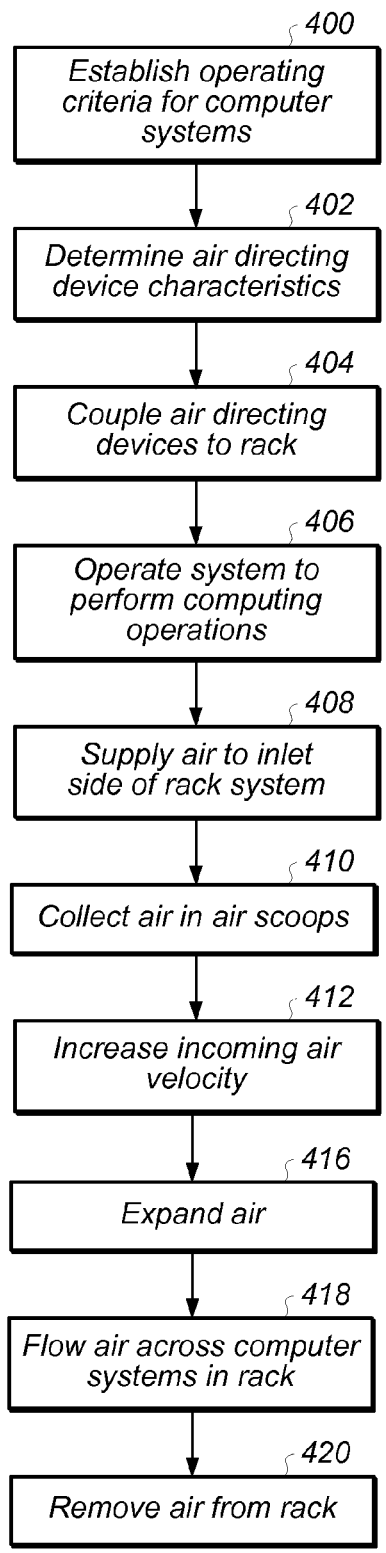
FIG. 12 is a flow diagram illustrating one embodiment of cooling rack systems in a computer room of a data center using air directing devices on the inlet side of a rack.

FIG. 12 illustrates one embodiment of removing heat from rack-mounted computer systems in a computer room of a data center. At 400, operating criteria for computer systems in a rack system are determined. The operating criteria may include, for example, a target operating temperature range for servers in the rack system. The operating criteria may include target locations to provide forced air cooling to one or more computer systems to be installed in the rack. A target location may be a point, zone, position (from left to right or front to back), area, or region of a computer system or rack. A target location may include, for example, a position along the width of a slot that aligns with the position of a central processing unit on a circuit board of a server to be installed in the slot. As another example, a target location may be the top slot in a rack, which may be warmer than other slots in the rack. At 402, the size, locations, shape and/or settings (such as aperture settings) of one or more air directing devices to be used in the system are determined.

At 404, air directing devices, including scoops for receiving air, are coupled to the rack at the determined locations. In some embodiments, an aperture in an air directing device may be adjusted. At 406, a system is operated to perform computing operations. At 408, air is flowed to the inlet side of the rack. At 410, air is collected in the scoops of one or more of the air directing devices. At 412, velocity of the air is increased. Air may pass through an opening in the air directing device (such as throat 114 of air directing device 100 described above with respect to FIG. 1). At 416, air may be expanded. In some embodiments, expansion of air in the air directing device may cool the air. At 418, the air may be passed over heat producing components in the computer systems in the rack. At 420, heated air may be removed from the rack.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. An air directing device, comprising:
   a rack-coupling portion configured to externally couple the air directing device with an exterior of a rack; and
   a body portion configured to be external to the rack, the body portion defining one or more air directing portions;
   wherein the one or more air directing portions include:
      one or more scoops configured to direct air into the body portion when the air directing device is externally coupled to the exterior of the rack;
      a plurality of air directing device exits comprising a first exit configured to direct air to a first location in the rack and a second exit configured to direct air to a second location in the rack;
      one or more throat openings within an interior of the body portion;
      one or more upstream passage sections extending within the interior of the body portion between the one or more scoops and the one or more throat openings, the one or more upstream passage sections configured to direct air from the one or more scoops to the one or more throat openings; and
      two or more downstream passage sections extending within the interior of the body portion between the one or more throat openings and the plurality of air directing device exits, the two or more downstream passage sections configured to direct air from the one or more throat openings to the plurality of air directing device exits, wherein the two or more downstream passage sections include:
  a first downstream passage section configured to direct air, at a first velocity, to the first exit that is configured to direct air to the first location in the rack; and
  a second downstream passage section configured to direct air, at a second velocity, to the second exit that is configured to direct air to the second location in the rack, the second velocity being different than the first velocity.

2. The air directing device of claim 1, wherein at least one of the air directing portions is configured such that at least a portion of air exiting the air directing device is at a higher velocity than at least a portion of the air entering the air directing device.

3. The air directing device of claim 1, wherein at least one of the one or more air directing portions is configured to restrict flow of at least a portion of the air in the air directing portion.

4. The air directing device of claim 1, wherein at least one of the scoops is configured to direct air from outside the rack into the rack.

5. The air directing device of claim 1, wherein the air directing device is configured to externally couple to the front of the exterior of the rack, wherein at least one of the scoops is configured to redirect air flowing in an at least partially upward direction into the body portion.

6. The air directing device of claim 1, wherein the air directing device is configured to externally couple to the front of the exterior of the rack, wherein at least one of the scoops is configured to redirect air flowing in an at least partially downward direction into the body portion.

7. The air directing device of claim 1, wherein the one or more upstream passage sections include at least one converging section upstream from at least one of the one or more throat openings, wherein the at least one converging section is configured to increase velocity of at least a portion of the air in the body portion.

8. The air directing device of claim 1, wherein the two or more downstream passage sections include at least one diverging section downstream from at least one of the one or more throat openings, wherein the at least one diverging section is configured to expand at least a portion of air in the body portion.

9. The air directing device of claim 1, wherein:
  the one or more upstream passage sections include at least one converging section upstream from at least one of the one or more throat openings, wherein the at least one converging section is configured to increase velocity of at least a portion of air in the body portion; and
  the two or more downstream passage sections include at least one diverging section downstream from at least one of the one or more throat openings, wherein the at least one diverging section is configured to expand at least a portion of air in the body portion and supply the air to a rack space upstream from one or more computer systems mounted to the rack.

10. The air directing device of claim 1, further comprising at least one metering plate configured to meter the flow of air through the opening.

11. A system for removing heat from rack-mounted computer systems in a computer room, comprising:
  one or more air handling systems configured to supply air to one or more rack systems in the computer room;
  one or more air directing devices external to at least one of the rack systems and configured to be coupled to an exterior of at least one of the rack systems, at least one of the air directing devices comprising:
    a rack-coupling portion configured to couple the air directing device with the exterior of the at least one of the rack systems; and
    a body portion defining one or more air directing portions;
    wherein the one or more air directing portions include:
      one or more scoops configured to direct air from outside the rack into the body portion and toward one or more computer systems in the rack when the air directing device is coupled to the exterior of the rack system,
      a plurality of air directing device exits comprising a first exit configured to direct air to a first location in the rack and a second exit configured to direct air to a second location in the rack;
      one or more throat openings within an interior of the body portion;
      one or more upstream passage sections extending within the interior of the body portion between the one or more scoops and the one or more throat openings, the one or more upstream passage sections configured to direct air from the one or more scoops to the one or more throat openings;
      two or more downstream passage sections extending within the interior of the body portion between the one or more throat openings and the plurality of air directing device exits, the two or more downstream passage sections configured to direct air from the one or more throat openings to the plurality of air directing device exits, wherein the two or more downstream passage sections include:
        a first downstream passage section configured to direct air, at a first velocity, to the first exit that is configured to direct air to the first location in the rack; and
        a second downstream passage section configured to direct air, at a second velocity, to the second exit that is configured to direct air to the second location in the rack, the second velocity being different than the first velocity.

12. The system of claim 11, wherein the one or more air directing devices comprise a first air directing device coupled at a first position along the width of the rack system and a second air directing device coupled at a second position along the width of the rack system, wherein the second position along the width of the rack system is different than the first position.

13. The system of claim 12, wherein the at least one of the rack systems includes multiple slots that are individually configured to have one or more computer systems installed therein, and the first air directing device and the second air directing device are coupled at a same slot of the multiple slots.

14. The system of claim 12, wherein the at least one of the rack systems includes multiple slots that are individually configured to have one or more computer systems installed therein, and the first air directing device and the second air directing device are coupled at different slots of the multiple slots.

15. The system of claim 11, wherein the air handling system is configured to supply air from below an inlet side of at least one of the rack systems, wherein at least one scoop of the one or more scoops of the at least one of the air directing devices faces at least partially downwardly so as to collect upwardly moving air from the air handling system and redirect the air into the body portion of the at least one of the air directing devices.

16. The system of claim 11, wherein the air handling system is configured to supply air from above an inlet side of at least one of the rack systems, wherein at least one scoop of the one or more scoops of at least one of the air directing devices faces at least partially upwardly so as to collect downwardly moving air from the air handling system and redirect the air into the body portion of the at least one of the air directing devices.

17. The system of claim 11, wherein the one or more air directing devices comprises a first air directing device and a second air directing device, wherein the first air directing device comprises a first metering plate comprising a first orifice, and a second metering plate comprising a second orifice, wherein the size of the first orifice is different than the size of the second orifice.

18. The system of claim 11, wherein at least one of the rack systems comprises a first inlet side and a second inlet side on a side of the rack opposite the first inlet side, the system further comprising at least one air directing device on each of the first inlet side and the second inlet side.

19. The system of claim 11, further comprising at least one exit air directing device coupled to at least one of the rack systems, wherein the exit air directing device is configured to direct air exiting the at least one rack system.

20. The system of claim 11, wherein at least one of the one or more computer systems is mounted in at least one of the rack systems at an upward slant, such that at least one air exit for the at least one computer system is higher than at least one air inlet for the at least one computer system.

21. The system of claim 11, wherein at least one of the air directing devices is configurable to slide transversely in a slot in the rack.

22. The system of claim 11, wherein at least one of the air directing devices comprises an aperture adjustment mechanism.

23. The system of claim 11, further comprising at least one blanking plate configured to block air in at least one slot in the rack that includes one of the air directing devices.

24. A method of cooling rack mounted computer systems in a computer room, comprising:
externally coupling at least one air directing device including one or more air directing portions comprising at least one scoop, wherein the at least one air directing device is external to at least one rack system comprising a rack in the computer room and is externally coupled to an exterior of the at least one rack system;
directing air through the at least one scoop of the at least one air directing device;
directing air, via one or more upstream passage sections, from the at least one scoop to one or more throat openings within an interior of the air directing device, the one or more passage sections extending within the interior of the air directing device between the one or more scoops and the one or more throat openings;
directing a first air stream, via a first downstream passage section, from the one or more throat openings to a first exit of the air directing device that is configured to direct air to a first location in the rack, the first downstream passage section extending within the interior of the air directing device between the one or more throats and the first exit; and
directing a second air stream, via a second downstream passage section, from the one or more throat openings to a second exit of the air directing device that is configured to direct air to a second location in the rack, the second downstream passage section extending within the interior of the air directing device between the one or more throats and the second exit;
wherein the air directed to the first location is at a different velocity than the air directed to the second location.

25. The method of claim 24, further comprising directing at least a portion of the air at an increased velocity toward a location of at least one computer system in the at least one rack system.

26. The method of claim 24, further comprising expanding at least a portion of the air that passes through the at least one scoop.

27. The method of claim 24, wherein externally coupling at least one air directing device to the exterior of the at least one rack system comprises coupling a first air directing device at a first location and coupling a second air directing device at a second location.

28. The method of claim 24, wherein externally coupling the at least one air directing device to the exterior of the at least one rack system comprises:
determining, for at least one of the rack systems, at least one target location in the rack system; and
coupling at least one of the air directing devices comprising the at least one scoop to the rack system so as to direct air to the determined at least one target location.

29. The method of claim 24, wherein externally coupling the at least one air directing device to the exterior of the at least one rack system comprises:
determining, for at least one of the rack systems, at least two target locations in the rack system; and
coupling at least one of the air directing devices to the rack system at each of the at least two target locations so as to direct air to the determined at least two target locations.

* * * * *